United States Patent [19]

Stringer

[11] Patent Number: 5,554,928
[45] Date of Patent: Sep. 10, 1996

[54] MANUFACTURING DEFECT ANALYZER

[75] Inventor: Philip J. Stringer, Chertsey, England

[73] Assignee: Teradyne, Inc., Boston, Mass.

[21] Appl. No.: 560,854

[22] Filed: Nov. 20, 1995

Related U.S. Application Data

[62] Division of Ser. No. 329,031, Oct. 25, 1994, Pat. No. 5,521,513.

[51] Int. Cl.⁶ .......................... G01R 31/02; H01H 31/02
[52] U.S. Cl. .................... 324/158.1; 324/523; 324/537
[58] Field of Search ............................. 324/158.1, 73.1, 324/523, 537, 538, 756

[56] References Cited

U.S. PATENT DOCUMENTS

| | | | |
|---|---|---|---|
| 4,749,945 | 6/1988 | Bonifert et al. | 324/755 |
| 4,779,041 | 10/1988 | Williamson | 324/537 |
| 4,779,043 | 10/1988 | Williamson | 324/537 |
| 4,864,219 | 9/1989 | Parsons | 324/73.1 |
| 4,894,605 | 1/1990 | Ringleb et al. | 324/537 |
| 5,072,175 | 12/1991 | Marek | 324/537 |
| 5,124,660 | 6/1992 | Cilingiroglu | 324/538 |
| 5,216,358 | 6/1993 | Vaucher | 324/754 |
| 5,254,953 | 10/1993 | Crook et al. | 324/538 |
| 5,280,237 | 1/1994 | Buks | 324/73.1 |
| 5,294,883 | 3/1994 | Akiki et al. | 324/158.1 |
| 5,357,191 | 10/1994 | Grace | 324/754 |
| 5,399,975 | 3/1995 | Laing et al. | 324/537 |
| 5,420,500 | 5/1995 | Kerschner | 324/72.5 |
| 5,426,361 | 6/1995 | Simmons | 324/158.1 |
| 5,469,064 | 11/1995 | Kerschner et al. | 324/537 |
| 5,489,851 | 2/1996 | Heumann et al. | 324/523 |

FOREIGN PATENT DOCUMENTS

0571963A2  1/1993  European Pat. Off. .

OTHER PUBLICATIONS

Orientation Testing of ICs in Automatic Insertion Equipment; Akar, Armagan A.; ATE West Conference; Jan. 14–17, 1985.

L529/L527 Assembly Inspection System; Teradyne publication; Feb. 1979.

*Primary Examiner*—Ernest F. Karlsen
*Attorney, Agent, or Firm*—Edmund J. Walsh

[57] ABSTRACT

A method for detecting faults on a printed circuit board populated with semiconductor electronic components. To detect faults, signal pins on the components are taken in pairs. The an indication of the common mode resistance between those pins and ground is computed from a series of current measurements. An error is detected when the common mode resistance is outside of a predetermined range. A "learn mode" is also disclosed in which the pairs of leads used for the test are selected by taking measurements on a known good board without detailed knowledge of the semiconductor components on the board.

8 Claims, 5 Drawing Sheets

5,554,928

MANUFACTURING DEFECT ANALYZER

This application is a divisional of application Ser. No. 08/329,031, filed on Oct. 25, 1994, now U.S. Pat. No. 5,521,513.

This invention relates generally to automatic test equipment and more particularly to a method and apparatus for locating faulty connections on printed circuit boards.

In the manufacture of printed circuit boards (PCBs), numerous electrical components are soldered to the board. Faulty connection of components to the printed circuit board represents a large percentage 0f the defects in finished PCBs. Faulty components also represent a source of defects in finished printed circuit boards.

To test for these types of defects, PCB manufacturers have traditionally used automatic test equipment (herein "testers") to detect defects in PCBs. Testers conventionally include a fixture to hold the PCB. The fixture includes a "bed of nails," which is made up of numerous conducting pins arranged in an array. When the PCB is placed in the fixture, each of the pins contacts a specific location, or "node," on the PCB. In this way, the tester can make electrical contact to the PCB.

The tester includes signal sources and measuring devices. Some signal sources generate digital signals, while others generate AC or DC voltages or currents. The measuring devices receive the same types of signals.

The signal sources and measuring devices are connected to the pins through a switching network. In this way, various signals can be applied to selected nodes on the PCB and signals at selected nodes can be measured.

The signal sources, measuring devices and switching network are connected to control circuitry. The control circuitry executes tests which have been programmed by a human test engineer. During a test, the tester applies signals to selected portions of the PCB. The response of a properly functioning PCB to those signals is programmed into the control circuitry. Responses are measured and an error is indicated when the measured response does not match the programmed expected response. Using such a tester, defects caused by improperly functioning components as well as faulty connection of components can be detected.

In recent years, quality control in the manufacture of electronic components has increased. Also, incoming inspection techniques have become successful at weeding out defective components before they are installed on PCBs. As a result, it has become less important to test PCBs for defective components. Rather, manufacturers have chosen to limit testing of PCBs in some cases to searching for faulty connection of components. Testers which detect only faulty connection of components without checking for proper operation of those components have been named "manufacturing defect analyzers."

Several manufacturing defect analyzers make use of the fact that semiconductor electrical components are constructed in a fashion which forms a diode between each lead of the component and ground. These diodes are reversed biased and therefore non-conducting, during normal device operation. However, their presence allows for the formation of a conducting path in a properly connected component. That conducting path can be detected to verify that the lead is properly connected.

U.S. Pat. No. 4,779,041 to Williamson injects current into a node on the PCB which should be connected to one lead of a semiconductor component to forward bias the parasitic diode associated with that lead. The voltage at that node is then measured. The measured voltage should reflect the voltage drop across the diode plus the voltage drop across the substrate of the semiconductor component. Simultaneously, a larger current is injected into a node which should be connected to a second lead of the device. That current should also flow through the substrate and create a larger voltage drop. If both leads are properly connected to the PCB, an increase in voltage should be measured at the first lead. Failure to observe an increased voltage indicates that at least one of the leads is not connected to the PCB.

There are certain drawbacks to this testing approach. First, each node on the PCB is often connected to the leads of several devices. The current which is injected into the lead being tested will actually be shared among all the leads connected to the same node. As a result, the current flow through the lead being tested can be significantly reduced and the measured signal will be relatively small. A small measured signal increases the possibility of a faulty measurement due to noise or otherwise requires more expensive measurement devices.

A second drawback of the prior art technique occurs if the two nodes into which current is injected for the test are connected together through another component on the circuit board. For some components, a current injected at one lead produces a voltage change at the other. In this situation, the prior art technique might indicate that both leads are properly connected to the board because of the signal coupled through the second component, whether or not the leads are actually properly connected. To avoid a false reading, a technique called "guarding" must be used. With guarding, the connections between the two nodes on the printed circuit board are grounded so that the only way the current injected into the second lead can influence the voltage at the first lead is through the device being tested. However, guarding is not always possible. For example, when the connection between the first and second leads is through a single resistor, guarding will not be effective. Also, where very small signal levels are involved, guarding is sometimes not effective. Further, guarding requires a complex program generator to analyze the printed circuit board and determine which leads of which components should be grounded in order to make each measurement. Such programs are often slow and innacurate. As a result, a test engineer must manually check the guarding scheme provided by these programs and make changes as appropriate. This problem is compounded in a manufacturing defect analyzer which performs tests on every lead of every component on the PCB.

Another drawback results because in most PCBs multiple electrical components are connected to each node. When a test current is injected into the second node, the voltage induced at the first node is related to the current flow through the substrate of the part being tested as well as the current flow through the traces on the PCB connecting that part to ground. When other components are connected to the second node, and will pass current to the traces on the PCB. This current flow will induce a voltage which might be detected at the first node used for the test. It thus creates a false signal even if the second lead is not properly connected to the PCB or to the device.

Another drawback is that the prior art approach requires a tester which can independently provide two current signals. Many commercially available testers do not provide this capability.

European patent application 0 575 061 A1 to Alexander also makes use of the parasitic diodes in semiconductor components. In that disclosure, the power and ground pins of the semiconductor components are connected to a reference voltage. An alternating voltage is applied to another pin. If all the pins are properly connected, the applied voltages will reverse bias diodes and current will flow inside the semiconductor component. This current is indirectly sensed by a probe placed over the component.

This approach has the drawback of requiring that a probe be mounted over the component being tested. Such an arrangement complicates the tester design. In particular, the bed of nails fixture, which is normally a readily available component, must be modified to hold the probe and to accomodate electrical connections to the probe. A further drawback occurs when there are multiple ground and power supply returns on a part. These multiple returns reduce the level of what is already a very small signal.

SUMMARY OF THE INVENTION

With the foregoing background in mind, it is an object of this invention to provide a simple manufacturing defect analyzer to detect open circuits without requiring additional fixturing to hold devices above the PCB under test.

It is also an object to provide a method of detecting manufacturing defects which can be programmed into commercially available testers.

It is a further object to provide an accurate and reliable method of detecting manufacturing defects which is largely independent of the types of components mounted on a PCB or the nodes selected for testing.

The foregoing and other objects are achieved in a tester having a voltage source and a current meter which can be connected between selected nodes on a PCB. According to the method of the invention, the voltage source is connected to two leads of a component and the current flow through the source is measured. The same voltage source and current meter are also connected to the same two leads individually and the current flow measured. From these measurements, an indication of the common resistance between the leads may be calculated. When the common resistance is in a predetermined range, the two selected leads and the ground lead of the semiconductor component are deterined to be properly connected to the PCB. In one embodiment of the invention, the method is performed by programming a commercially available bed-of-nails tester.

In an alternative embodiment of the invention, two different voltage sources are applied to separate leads. The difference current into one lead when only one source is driving a lead and when both sources are driving leads is measured. The measured current difference is used as an indication of proper connection of both leads.

According to another feature of the invention, the manufacturing defect analyzer is implemented with circuitry which can accurately measure small changes in signals. The circuitry is implemented with a differential amplifier having one input connected to a sample and hold circuit. A switch connects the input signal first to the sample and hold circuit and then directly to the second input of the differential amplifier.

BRIEF DESCRIPTION OF THE DRAWINGS

The invention may be better understood by reference to the following more detailed description and accompanying drawings in which.

DESCRIPTION OF THE PREFERRED EMBODIMENT

Figure 1:
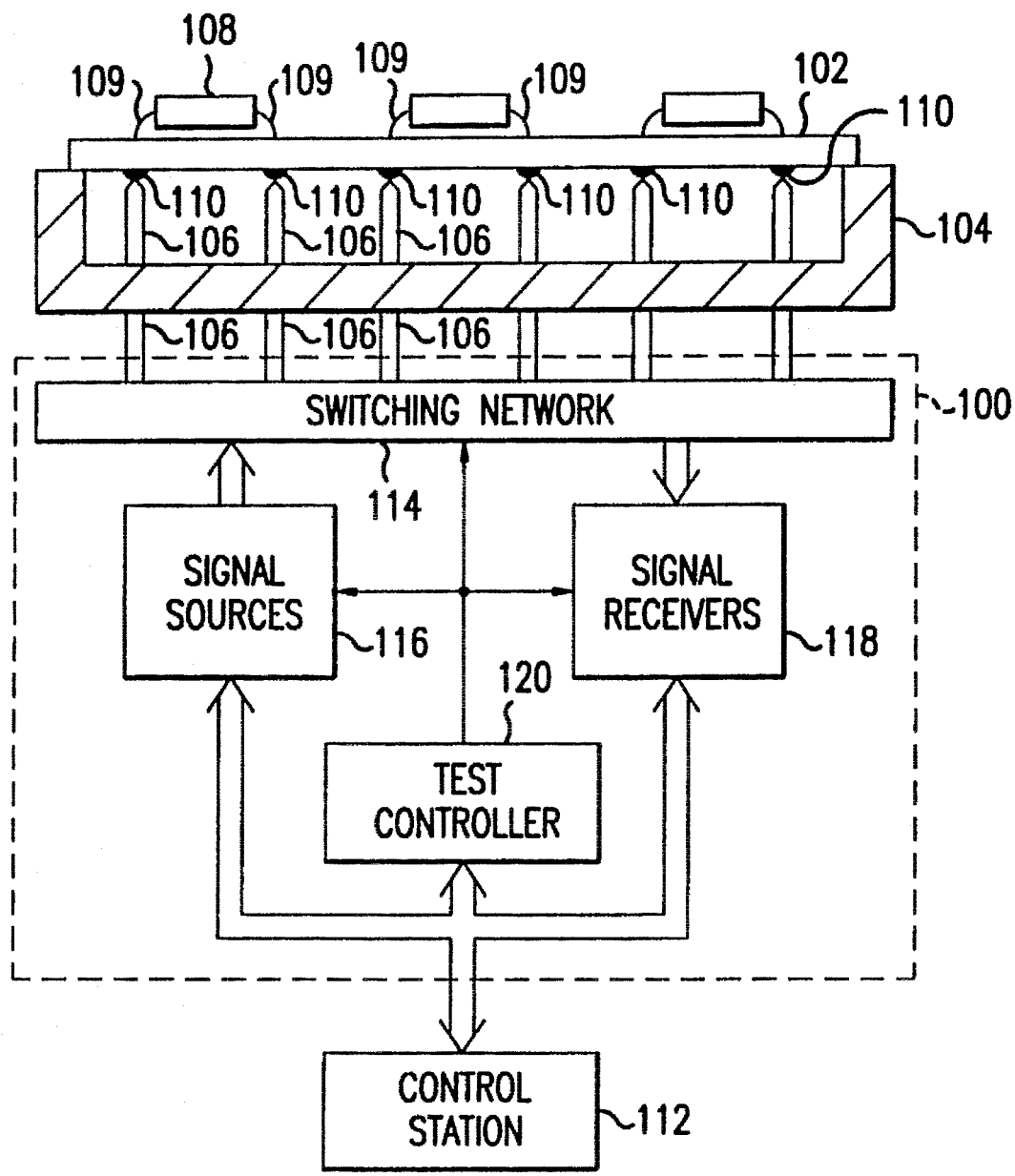
FIG. 1 is a block diagram of a tester which can be programmed to utilize the invention.

FIG. 1 shows a tester 100 which may be programmed to operate as a manufacturing defect analyzer according to the invention. FIG. 1 shows a printed circuit board (PCB) 102 mounted in a fixture 104 attached to tester 100. Fixture 104 is a conventional bed of nails fixture and contains a plurality of nails or pins 106.

PCB 102 is populated with numerous semiconductor components 108. The leads 109 of components 108 are, in a correctly manufactured board, soldered to conductive traces 110 on PCB 102. Pins 106 contact these conductive traces for the purpose of injecting test signals or verifying responses to the injected test signals.

Pins 106 are connected through a switching network to either signal sources 116 or signal receivers 118. Signal sources 116 provide test signals at appropriate times. Likewise, signal receivers 118 receive signals at appropriate times and compare them to programmed expected values. Test controller 120 provides control signals to signal sources 116, signal receivers 118 and switching network 114 to control which signals are applied to which of the pins 106 at any given and which of the pins 106 is connected to which of the signal receivers at any given time.

The operation of tester 112 is programmed by a human user via control station 112. Control station 112 is connected, such as through a digital bus, to signal sources 116, signal receivers 118 and test controller 112 and provides control information to these components.

Control station 112 is a general purpose computer with a user interface such as a keyboard and a display terminal (not shown). It includes data storage devices, such as disk drives (not shown). Test programs are stored on these devices and executed by the processor in the computer. The control station also includes programs which receive data generated during a test and display it in a format useful to a human operator.

In a preferred embodiment, tester 100 is a commercially available board tester, such as a Z1800 available from Teradyne, Inc. of Walnut Creek, Calif., U.S.A. or equivalent product sold by other manufacturers. However, an advantage of the invention is its simplicity. To perform a test according to the method of the invention, it is only necessary that signal sources 116 include one voltage source and signal receivers 118 include one current measuring circuit. A separate test controller 120 is not a requirement of the invention. Control station 112 could directly control the voltage source within signal sources 116 and the current meter within signal receivers 118 and the switching network 114.

Figure 2A:
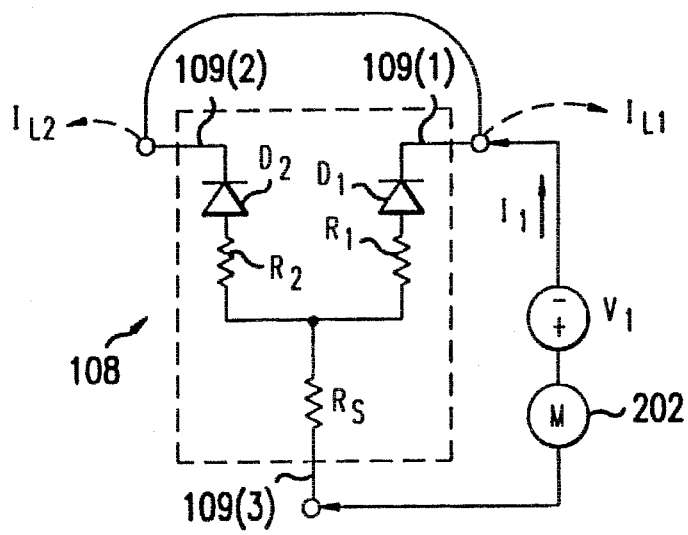
FIGS. 2A–2C are electrical schematics of equivalent circuit formed at various times during a test.

Turning now to FIG. 2, the programming of tester 100 is described in greater detail. FIG. 2A shows the equivalent electrical schematic of a portion of a semiconductor component 108. Three leads, 109(1), 109(2) and 109(3) are shown. Lead 109(3) is a ground lead of component 108. All of the signal leads are connected to ground in a normal semiconductor component through the semiconductor substrate. This connection is shown as being made through a diode $D_1$ or $D_2$ and through a resistance $R_s$. The resistance $R_s$ represents the lumped resistance of the substrate itself and other resistance associated with the path between the pins and ground.

FIG. 2 does not show other parts of the circuit inside semiconductor component 108. It will be understood, though, that a typical semiconductor component contains numerous transistors or other devices which provide the component with its functionality. Those additional components are not shown because they do not affect the test method described herein. The methodology described herein can detect manufacturing defects regardless of the type of components installed on the printed circuit board.

In the first step of the test, voltage source $V_1$ is connected between leads 109(1) and 109(3). It will be appreciated from FIG. 1 that connection of a signal source 116 is made through switching network 114 to one of the pins 106 which contacts a conductive trace 110 on PCB 102. The conductive trace is selected to be one to which the desired lead should be connected. Herein, connection to a trace to which a lead should be connected will be described as making a connection to that lead. It will be appreciated, though, that one purpose of the test is to determine whether that lead is in fact connected to the trace. Likewise, FIG. 2 shows that connections are made directly to the leads 109, and does not reflect the possibility that the connection is broken.

Voltage source $V_1$ preferably has an output voltage of between −0.1 V and −5 V. More preferably, it has a voltage between −0.7 V and −1.2 V. However, the exact voltage used may vary depending on the type of device being tested. This voltage level is preferably constant within 0.01% for currents ranging from 10 mA to 1 A to allow for the fact that multiple leads from various components might be connected to the same node and could all sink current during a test. The voltage source $V_1$ is connected with a polarity to forward bias the diodes $D_1$ and $D_2$.

Current meter 202 is connected in series with voltage source V1. Current meter 202 preferably produces a digital output signal indicating the current flowing from voltage source V1. Current meter 202 preferably has a range of at least 10 mA to 1 A with sufficient accuracy to resolve 10 microamps over this range. It should preferably have an accuracy greater than 0.01%.

For the first measurement as shogun in FIG. 2A, leads 109(1) and 109(2) are connected together. With this arrangement, the current $I_1$ is measured and the value recorded.

Figure 2B:
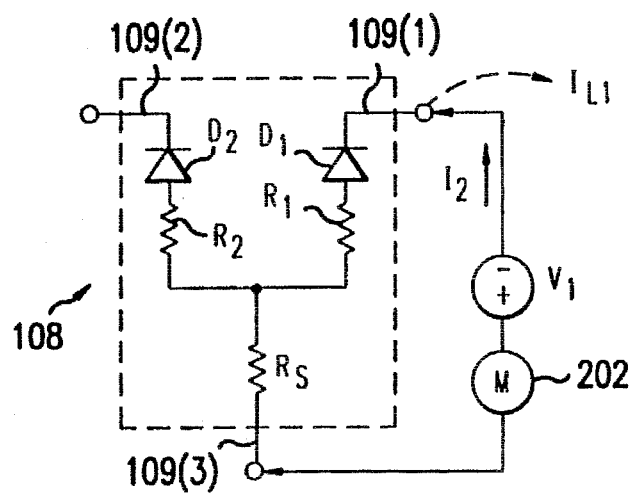

FIG. 2B shows the next step of the test. In FIG. 2B, the voltage source $V_1$ and current meter 202 are connected in series between leads 109(1) and 109(3). The current $I_2$ is measured and recorded.

Figure 2C:
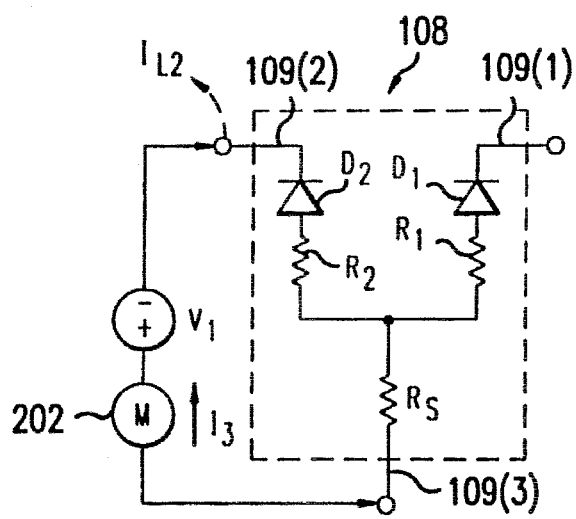

FIG. 2C shows the next step of the test. In this step, voltage source $V_1$ and current meter 202 are connected in series between leads 109(2) and 109(3). The current $I_2$ is measured and recorded.

Once the three currents, $I_1$, $I_2$ and $I_3$, are measured, the common resistance between leads 109(1) and 109(2) and ground can be computed. This computed resistance represents Rs. The measured values are provided to control station 112 where a computer program to perform the computation is executed. The equations needed to compute the common resistance can be derived by applying Ohm's law to the circuits of FIG. 2A to compute $I_1$:

$$I_1=(V_1-V_D)/(R_1\|R_2+R_s)$$

where $R_1$ and $R_2$ are the differential mode resistances into leads 109(1) and 109(2), respectively, and the notation $R_1\|R_2$ means that the resistances are in parallel. $V_D$ is the voltage drop across a forward biased diode.

This equation may be rewritten $$R_s=\{(V_1-V_D)-I_1(R_1\|R_2)\}/I_1.$$

The measurements taken in conjunction with FIG. 2B and 2C allow $R_1$ and $R_2$ to be expressed in terms of measured values. Namely, $$I_2=(V_1-V_D)/(R_1+R_s)$$

$$I_3=(V_1-V_D)/(R_2+R_s)$$

can be rewritten as follows:

$$R_1=\{(V_1-V_D)-I_2R_s\}/I_2$$

$$R_2=\{(V_1-V_D)-I_3R_s\}/I_3$$

With these equations, $R_s$ can be expressed as follows:

$$R_s=V_1(I_2+I_3-I_1)/2I_2I_3$$

The foregoing equation is valid when $R_s$ is much less than $(R_1+R_2)$, which is usually the case because $R_1$ and $R_2$ represent the resistances of diodes whereas $R_s$ is the resistance of the semiconductor substrate.

This final equation is expressed only in terms of the measured values of the current and the applied voltage. Rs can therefore be calculated using this equation.

It is not necessary to actually calculate the value of Rs. The difference in currents, $(I_2+I_3-I_1)$, is a sufficient indicator of the substrate resistance that the actual value of Rs need not be computed in ohms. Hereinafter, the difference in currents $(I_2+I_3-I_1)$ will also be referred to as Rs. In the tester of FIG. 1, the computation of $R_s$ is performed in control station 112.

To determine whether the leads 109(1) and 109(2) are properly connected to the PCB, the computed value of $R_s$ is compared to the range of known good values for that measurement. Known good values are typically determined by making repeated measurements on a board which is known to be properly assembled. If the measured current difference is significantly below the range of expected values, then one of the leads 109(1), 109(2) or 109(3) is not properly connected to the PCB and an error is indicated. Typically, a value of about one third of the known good value would be used as a threshold.

It will be appreciated that when the lead being tested is connected to other components on the PCB, there will be current flow out of the node to which the lead being tested is connected. These currents are shown as $I_{L1}$ and $I_{L2}$ in FIG. 2. These currents do not impact the accuracy of the test technique as the difference in the measured currents will be proportional only to the common resistance through the substrate between leads 109(1) and 109(2).

To test a PCB, it is necessary to select the leads of each component in pairs for testing. Each lead should be included in at least one pair. To test a full board, switching network 114 is configured to first test one pair of leads. The current measurements are made and the common resistance between those pins is computed and compared to the expected value. If there is an error, it is reported in any convenient fashion. The test then proceeds by selecting another pair and testing continues in this fashion until all leads on the PCB have been included in a pair.

If there are other components other than semiconductor integrated circuits on the PCB to be tested, they may be tested according to conventional in-circuit tets techniques.

Test techniques for verifying the proper connection of such components as resistors and capacitors are well known.

The method of testing a component described above involves selecting leads in pairs in conjunction with a ground lead. In testing a PCB, a test engineer normally has access to what is called a "net list." The net list describes which leads are connected together, i.e. are on the same "net." One net on the PCB is the ground net, such that it is possible to know which leads of each component are connected to ground.

The pairs of leads used in the testing could be selected at random as the test method of the invention should function for any pair of leads on a component. It might be desirable, though, to use a "learn mode." In learn mode, a known good PCB is placed in the test fixture and measurements are made on pairs of leads until a list of lead pairs to be used in the test has been created.

The list of lead pairs should preferably be as short as possible so that the test may be completed quickly. Also, the selected pairs should allow testing to be as accurate as possible. There are several ways that pairs could be selected to allow the testing to be as accurate as possible. One way is to select only pairs that yield a relatively high current difference $(I_2+I_3-I_1)$. In this way, the measurement is not likely to be influenced by noise. Also, several pairs could be used test to a lead if it failed on the first measurement. In this way, a false falure will not be reported due to a spurious signal or a deviation in the component on the PCB. A further way to make the test more accurate is to "learn" a voltage level for each pair of pins which will most accurately test that pair of pins. Still another way to make the test more accurate is to ensure that other components on the net do not give false positive signals.

FIG. 3 shows a flow chart of the operation of tester 100 (FIG. 1) during learn mode. The program starts at step 302 by selecting one of the components on the known good PCB from the net list. At step 302, one signal lead on the selected component is selected. At step 306, a second lead on the component is selected to make a pair with the lead selected at step 304.

At step 308, the current difference $(I_2+I_3-I_1)$ for the selected pair is measured. The measurement method is as described above in conjunction with FIG. 2.

At step 310, the measured current difference is compared to the range which is appropriate for use in a test. For a typical board, that range is preferably 1 µA to 10 µA. If the measured current difference is within the acceptable range, the pair of leads is added to a data base of lead pairs.

Execution then continues at step 314. If there are more signal leads that can be paired with the lead selected at step 304, another lead is selected at step 306. Steps 308, 310 and, if indicated step 312, are repeated.

If there are no other leads that can be paired with the first lead selected, execution proceeds to step 316. If there are more leads on the component which have not been used as the first lead in a pair, execution returns to step 304. A new lead is selected as the first lead of the pair at step 304. Steps 306, 308, 310, 312 if necessary, and 314 are repeated to add further lead pairs to the data base.

When all the leads are on one component are paired, execution proceeds to step 318. If there are more components described in the net list, execution returns to step 302 where another component is selected. The process is repeated until all the possible pairs having common mode resistances in a desirable range are identified.

Figure 3A:
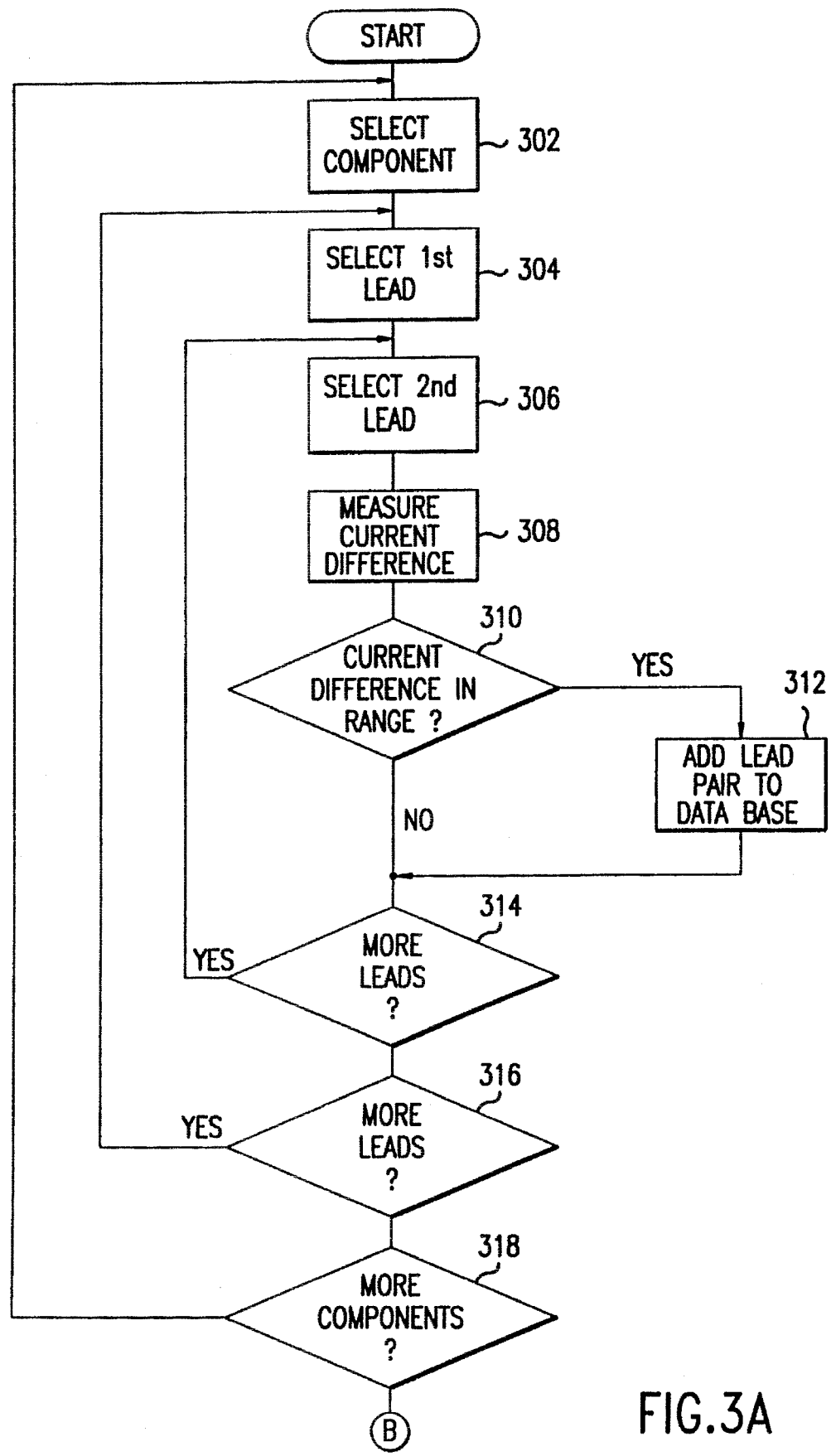
FIGS. 3A and 3B is a flow chart of the software running a tester of the invention during a learn mode.
Figure 3B:
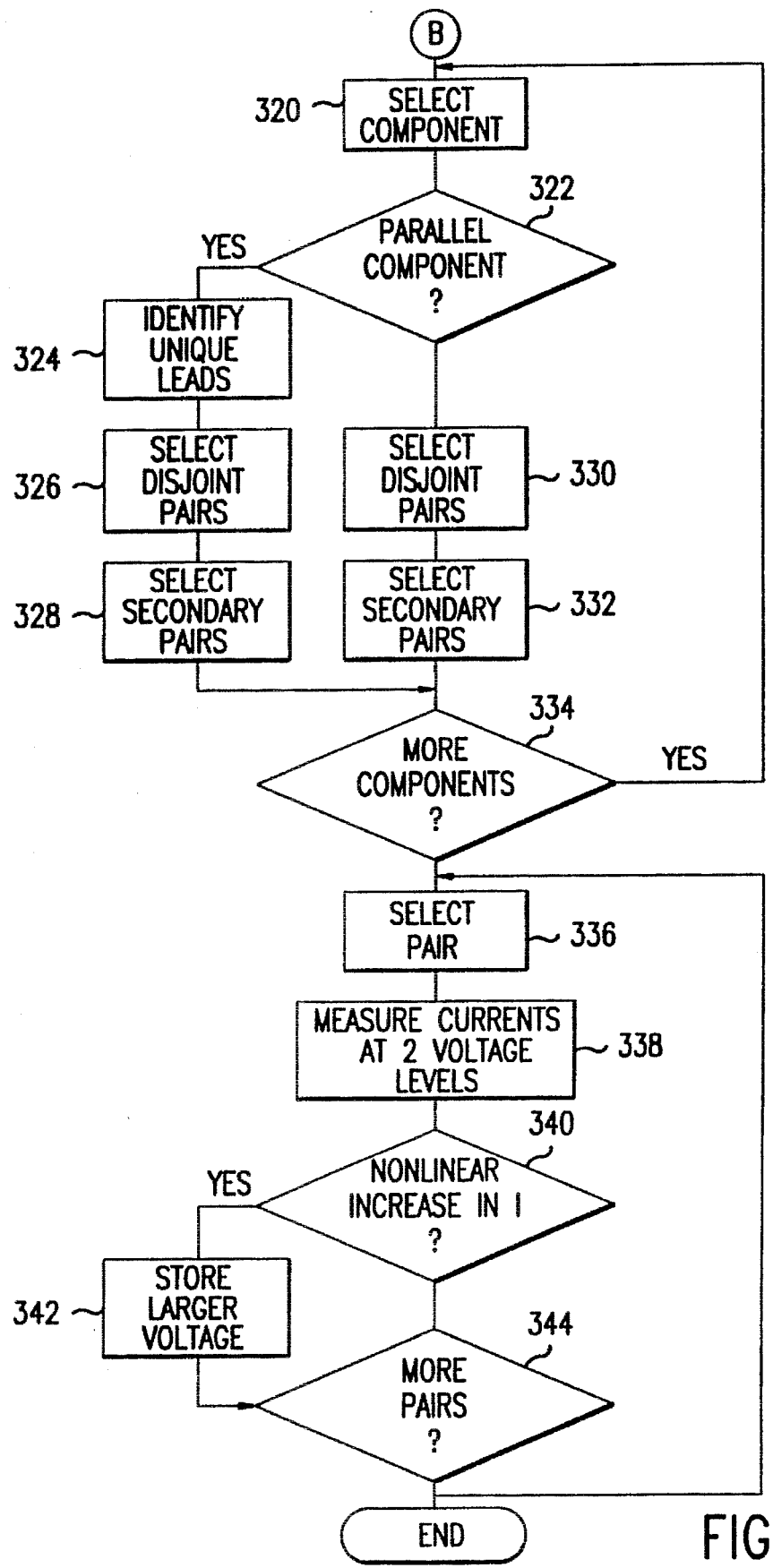

The program flow continues in FIG. 3B which depicts the process steps necessary to select from the database created by the process steps in FIG. 3A those pairs of leads used in a test. At step 320, one component is selected from the net list.

At step 322 it is determined whether the selected component is connected in parallel to another component. Two components are said to be connected in parallel when two or more leads of one component are connected to two or more leads of the second component. An example of a parallel connection is chips connected to an address bus. The address bus might have sixteen separate signal lines. Each signal line runs to one lead of each component connected to the bus. If components U1 and U2 are both connected to the bus, leads L1 to L16 of component U1 might be connected to the lines of the bus while leads L17 to L32 of U2 might be connected to the lines of the bus. Thus, leads L1 to L16 of U1 are each connected to one of the leads L17 to L32 of U2.

For testing according to the invention, it is not desirable to select a pair of leads from the set which is connected to lines shared with another component. For example, leads L1 and L2 of component U1 are connected to leads L17 and L18 of component U2. If leads L1 and L2 were select as a pair for a test and the test indicated a proper connection, it would not be possible to determine whether the test was reporting a correct connection because L1 and L2 on U1 were connected correctly or because L17 and L18 on U2 were connected correctly. Accordingly, selecting L1 and L2 to test U1 would not reveal errors.

When, as determined at step 322, there are parallel connections to the selected component, processing proceeds at step 324. At step 324, unique leads are identified. A unique lead is one which can be paired with another lead on that component such that both are not connected to leads on another component. In the example given above, if lead L17 of component U1 were not connected to component U2, it would be a unique lead which could be paired with leads L1 to L16 for a test.

Execution then proceeds to step 326 at which disjoint pairs are selected. Disjoint pairs are pairs of leads which, to the greatest possible extent, have no leads used to make, up more than one pair. For example, if a component has ten signal leads, those leads could be grouped into five disjoint pairs. If, however, the component is connected in parallel with another component, one unique lead may need to be used in multiple pairs such that some pairs will have that unique lead in common. Likewise, as a result of the determination made at step 310 (FIG. 3A), pairs needed to make disjoint pairs might not be included in the database of pin pairs. However, the set of pin pairs selected can be minimized by selecting pairs with as little overlap as possible.

Execution then proceeds to step 328. Once a set of pairs is selected to test every lead on the component, secondary pairs are selected to test each lead on the component. These secondary pairs are used in a test if the test of the primary pair indicates a failure. For example, leads L1 and L17 might be selected as a primary pair. If this pair, when tested, resulted in an indication that there was an error, other secondary pairs including leads L1 and L17 might be tested. The additional tests might indicate that there was in fact no error or might localize the error to one of the leads in the primary pair. In a preferred embodiment, six secondary pairs are selected.

If the selected component is not connected in parallel to other components, execution continues at step 330. At step 330, disjoint pairs are selected. Step 330 is identical to step 326, except that there needs to be no concern about using unique leads at step 330. Execution then proceeds to step 332 where secondary pairs are selected. Step 332 is similar to step 328, except that there is no concern about using unique leads.

Once the secondary pairs are selected, execution continues at step 334. At step 334, if there are more components, execution returns to step 320 where another component is selected. The process of selecting disjoint and secondary pairs continues for all remaining components.

Once the pairs which will make up a test are selected, execution continues at step 336. The first pair of leads to be used in the test is selected. Those leads are connect to a voltage source and current meter as shown in FIG. 2A. A first voltage is applied to the circuit and the current is measured. The voltage is then increased and the current is then measured.

At step 340, the applied voltages and measured currents are compared. If the current did not increase substantially linearly with the increase in voltage, it indicates that the applied voltage is close to or below the turn on voltage of diodes D1 and D2. If the first voltage level was close to the turn on voltage of the diode, the current should increase by a much greater percentage than the voltage. In such a scenario, it would be advisable to use a larger voltage for the test. Otherwise, slight variations in the voltage source used in the test might produce erratic results. Accordingly, at step 340 if a nonlinear increase in current is detected, execution proceeds to step 342 where an indication is stored in conjunction with that pair of leads that a larger voltage shold be used.

The larger voltage might be a predetermined value. Alternatively, the larger voltage could be selected adaptively. To adaptively select a voltage, the initial voltage could be selected to be zero or a very small value. The voltage could then be increased in small steps until a nonlinear increase in current was observed. This nonlinear increase in current would signal that the breakdown voltage of the diodes had been reached. The voltage could then be increased a small amount above the breakdown voltage. The voltage should be set to be an amount above the breakdown voltage which is greater than the expected variability of the voltage source. However, the voltage should not be set to such a high value that it produces a current which would damage the components being tested.

Execution then proceeds to step 344 where it is determined whether further pairs need to be checked. If more pairs remain, execution returns to step 336 where another pair is selected and the process is repeated.

Figure 4:
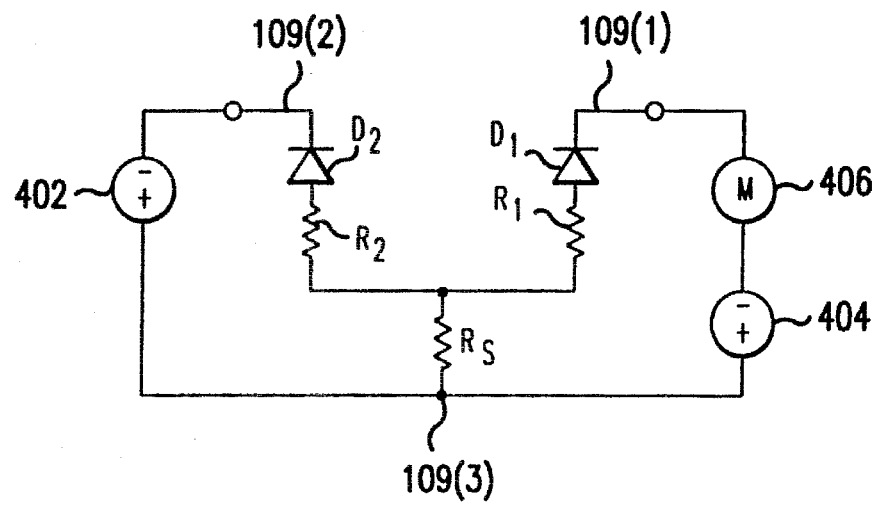
FIG. 4 is an electrical schematic of an alternative embodiment of the invention.

Having described a preferred embodiment of the invention, it will be apparent to one of skill in the art that various alternative embodiments could be formed. For example, FIG. 4 shows an alternative way of measuring a current indicative of the value of the common mode resistance between two leads. FIG. 4 shows a current meter 406 connected to a lead 109(1). A voltage source 404 is connected in series with current meter 406. With voltage source 404 turned on, a first current is measured. Next, voltage source 402 is connected to lead 109(2). With both voltage sources 402 and 404 turned on, current is again measured by meter 406. The change in current is an indication of the common mode resistance. A change in current indicates that leads 109(1), 109(2) and 109(3) are properly connected.

The voltage levels of sources 402 and 404 can be fixed or varied according to on of the techniques described above. Values of 0.9 V for source 404 and 1.2 V for source 402 have been found to be suitable for many types of integrated circuits.

The method depicted in FIG. 4 has the advantage of requiring fewer measurements and less computation than the method depicted in FIG. 2. It can therefore be used to more quickly test a board. Conversely, it requires two separate voltage sources for signal levels which can be accurately measured.

Figure 5:
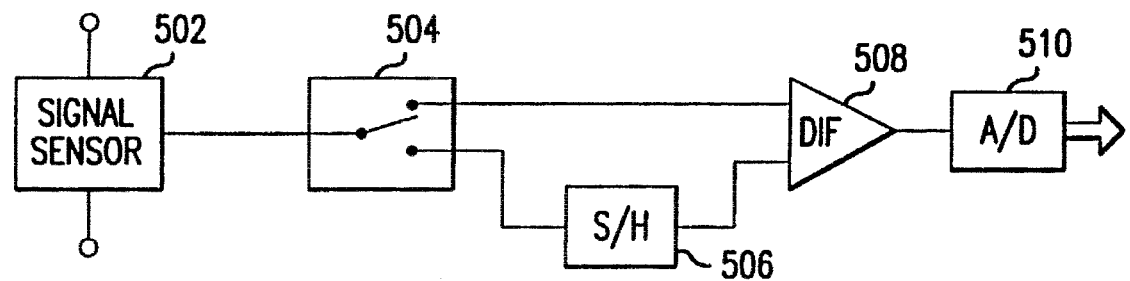
FIG. 5 is an electrical schematic of a circuit useful in measuring small changes in signals.

To provide greater testing speed and accuracy, the circuit of FIG. 5 can be used. That circuit accurately measures changes in a signal. FIG. 5 represents a circuit which would replace a meter such as current meter 406 and also eliminate the need to separately compute a current difference from two different measurements.

The circuit of FIG. 5 includes a signal sensor. To sense changes in a current signal, the signal sensor could be a resistor or a magnetic pickup. Buffer amplifiers or other standard engineering techniques could be used as well. A signal sensor could be omitted when measuring changes in a voltage signal.

The voltage signal developed by signal sensor 502 is passed to switch 504. Initially, switch 504 is configured to connect signal sensor 502 to sample and hold circuit 506. Sample and hold circuit 506 stores the level of the signal at a first time.

Switch 504 is then switched to connect signal sensor 502 to a first input of differential amplifier 508. The second input of differential amplifier 508 is connected to sample and hold circuit 506. Thus, differential amplifier 508 computes the amount the input signal has changed. This value is converted to digital form by analog to digital converter 510. This digital value can be provided directly to control station 112. Control signals needed to measure changes as described above and to coordinate these measurements with connection of sources to the circuit being tested are not explicitly shown. It will be appreciated that such control elements are required and should be implemented according to standard design practices.

Other variations are also possible. For example, it was described that three current measurements are made. It will be appreciated that the order in which the measurements is made is not important to the result. In addition, it is described that two leads are used to make the common mode resistance measurement. Any number of pins could be used. Also, the accuracy of the voltage source used in a preferred embodiment was given. The accuracy is not critical to the invention, though a less acurate test will result if a less accurate source is used. Also, it is not necessary that the voltage source be constant. Accurate results can be achieved if the variations in the voltage source can be predicted and the current measurements scaled in proportion to the changes in the voltage source. Similar considerations apply to the accuracy of the current metwrs used for the test. If a less accurate meter is used, known signal processing techniques can be used to make the test more accurate. For example, the signal might be amplified before it is measured to reduce the significance of the imperfections in the measurement process. Also, the significance of measurement errors can be reduced by taking several current measurements and then averaging.

Also, the technique could be used to identify components that are inserted into the PCB backwards. If the component is not symmetrical, its ground lead will not be in the expected location when the component is inserted backwards and all pairs tested will indicate an open circuit. If the component is symmetrical, even if it is inserted backwards, a connection will be made to a ground lead. However, the technique can be adapted to make a profile of each component to be assembled on the PCB by storing the expected common mode resistances measured at each pin pair. If the component is inserted backwards, the measured common mode resistances might indicate that all leads of the component are connected but will not match the stored profile. In this way, a symmetrical chip inserted backwards can be detected.

Therefore, the invention should be limited only by the spirit and scope of the appended claims.

What is claimed is:

1. A method of testing a printed circuit board with a plurality of semiconductor electronic components, each having a plurality of signal leads and at least one ground lead, mounted thereon, said method comprising the steps of:

a) applying a first voltage between a first signal lead and a ground lead of one semiconductor electronic component;

b) applying a second voltage between at least a second signal lead and a ground lead of the semiconductor electronic component;

c) measuring the change in current flow in the first lead between a time when the first voltage is connected to the first lead and a time when the first voltge is connected to the first lead while the second voltage is connected to the second lead.

2. The method of claim 1 wherein the step of measuring comprises:

a) connecting a signal indicative of the current in the first lead to a sample and hold circuit;

b) connecting the signal indicative of the current in the first lead to a first input of a differential amplifier; and c) connecting the sample and hold circuit to a second input of the differential amplifier.

3. A method of testing a printed circuit board having a plurality of semiconductor components mounted thereto, each semiconductor component having a plurality of signal leads and at least a ground lead, with each signal lead being connected to the ground lead through a diode inherently arising in the manufacturing process of the semiconductor component, each of the signal leads and ground leads intended to be connected to traces on the printed circuit board, the method comprising the steps of:

a) selecting a first signal lead and a second signal lead on a semiconductor component and making electrical connections to the traces on the printed circuit board which are intended to be connected to the selected first and second signal leads and a ground lead of the semiconductor component;

b) applying a voltage between the trace intended to be connected to the ground lead and the trace intended to be connected to the first signal lead, the applied voltage having a magnitude sufficient to forward bias the inherent diode between the first lead and the ground lead; and c) applying a second voltage between the trace intended to be connected to the second lead and the trace intended to be connected to the ground lead and determining the change in current flow in the trace intended to be connected to the first lead, the applied voltage being sufficient to alter by at least a threshold amount the current flow through the trace intended to be connected to the first lead when the first lead, the second lead and the ground lead are properly connected to the intended traces on the printed circuit board; and d) determining changes in the current flow in the trace intended to be connected to the first lead in response to the application of the second voltage and indicating a faulty connection when the changes are below the threshold amount.

4. The method of claim 3 wherein the step of selecting a first signal lead and a second signal lead includes the step of making an electrical connection to traces on the printed circuit board through a bed of nail fixture.

5. The method of claim 3 wherein the step of applying a first voltage comprises applying a voltage with a magnitude between 0.7 and 1.2 volts.

6. The method of claim 3 wherein the steps of applying a first voltage source and a second voltage source comprise applying voltages with separate voltage sources.

7. The method of claim 3 wherein the second voltage source is a varying voltage source.

8. The method of claim 7 wherein the step of determining the changes in current flow takes into account variations in the voltage source.

\* \* \* \* \*